(12) United States Patent
Liou et al.

(10) Patent No.: US 10,340,381 B2
(45) Date of Patent: Jul. 2, 2019

(54) METHOD FOR FABRICATING SEMICONDUCTOR STRUCTURE

(71) Applicant: UNITED MICROELECTRONICS CORP., Hsin-Chu (TW)

(72) Inventors: En-Chiuan Liou, Tainan (TW); Yu-Cheng Tung, Kaohsiung (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 0 days.

(21) Appl. No.: 16/180,033

(22) Filed: Nov. 5, 2018

(65) Prior Publication Data

US 2019/0088782 A1    Mar. 21, 2019

Related U.S. Application Data

(62) Division of application No. 15/627,427, filed on Jun. 19, 2017, now Pat. No. 10,153,369.

(30) Foreign Application Priority Data

May 10, 2017    (TW) .............................. 106115398 A

(51) Int. Cl.
  *H01L 29/78*    (2006.01)
  *H01L 27/088*   (2006.01)
  *H01L 29/66*    (2006.01)

(52) U.S. Cl.
  CPC ........ *H01L 29/7843* (2013.01); *H01L 27/088* (2013.01); *H01L 29/6656* (2013.01)

(58) Field of Classification Search
  CPC ............ H01L 29/7843; H01L 29/6656; H01L 27/088
  See application file for complete search history.

(56) References Cited

U.S. PATENT DOCUMENTS

| 8,436,404 B2 | 5/2013 | Bohr |
| 9,257,348 B2 | 2/2016 | Xie |
| 2008/0258234 A1 | 10/2008 | Henson |
| 2009/0001479 A1* | 1/2009 | Wiatr ................ H01L 21/28052 257/384 |
| 2011/0298017 A1* | 12/2011 | Jain ................... H01L 21/76897 257/288 |
| 2011/0306198 A1 | 12/2011 | Jeong |
| 2012/0126331 A1* | 5/2012 | Lin ................. H01L 21/823418 257/369 |
| 2015/0041905 A1 | 2/2015 | Xie |
| 2015/0084132 A1 | 3/2015 | Chou |
| 2016/0005731 A1 | 1/2016 | Chen |

* cited by examiner

*Primary Examiner* — Selim U Ahmed
(74) *Attorney, Agent, or Firm* — Winston Hsu

(57) ABSTRACT

The present invention provides a method for fabricating a semiconductor structure, the method at least comprises: firstly, a substrate is provided, a dielectric layer is formed on the substrate, a gate conductive layer and two spacers are formed and disposed in the dielectric layer, wherein the two spacers are respectively disposed on both sides of the gate conductive layer, next, parts of the gate conductive layer are removed, and parts of the two spacers are removed, wherein a top surface of the two spacers is lower than a top surface of the gate conductive layer, and afterwards, a stress cap layer is then formed, overlying the gate conductive layer and the two spacers, wherein parts of the stress cap layer is located right above the two spacers.

8 Claims, 4 Drawing Sheets

METHOD FOR FABRICATING SEMICONDUCTOR STRUCTURE

CROSS REFERENCE TO RELATED APPLICATIONS

This application is a divisional application of U.S. patent application Ser. No. 15/627,427 filed Jun. 19, 2017, which is herein incorporated by reference in its entirety.

BACKGROUND OF THE INVENTION

1. Field of the Invention

The present invention relates to a semiconductor structure and the manufacturing method thereof, and more particularly, to a method and a semiconductor structure for modifying the spacer to enhance the effect of a stress layer.

2. Description of the Prior Art

As semiconductor processes advance to the very deep sub micron level, how to increase the driving current for MOS transistors has become a critical issue in this field.

To attain higher performance of a semiconductor device, attempts have been made to use a strained silicon (Si) layer for increasing the mobility of electrons or holes. Taking advantage of a stressor is a common way to increase the effect of the MOS transistors. Forming a tensile or a compressive stressor on the substrate and using the MOS transistors to change the band structure of silicon can increase mobility of electrons.

SUMMARY OF THE INVENTION

The present invention provides a semiconductor structure, the semiconductor structure comprises a substrate having a dielectric layer disposed thereon, a gate conductive layer disposed on the substrate and disposed in the dielectric layer, two spacers disposed on two sides of the gate conductive layer respectively, wherein a top surface of the two spacers is lower than a top surface of the gate conductive layer, and a cap layer overlying the top surface and two sidewalls of the gate conductive layer, wherein parts of the cap layer is located right above the two spacers.

The present invention further provides a method for fabricating a semiconductor structure, the method at least comprises: firstly, a substrate is provided, a dielectric layer is formed on the substrate, a gate conductive layer and two spacers are formed and disposed in the dielectric layer, wherein the two spacers are respectively disposed on both sides of the gate conductive layer, next, parts of the gate conductive layer are removed, and parts of the two spacers are removed, wherein a top surface of the two spacers is lower than a top surface of the gate conductive layer, and afterwards, a stress cap layer is then formed, overlying the gate conductive layer and the two spacers, wherein parts of the stress cap layer is located right above the two spacers.

One feature of the present embodiment is that the spacers are partially removed, and the following-formed stress cap layer is closer to the channel region of the transistor. The stress cap layer not only covers the gate structure, and also covers parts of the sidewalls of the gate structure, so that the coverage area is larger, and it is more effective to transfer the stress of the stress cap layer to the channel region.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
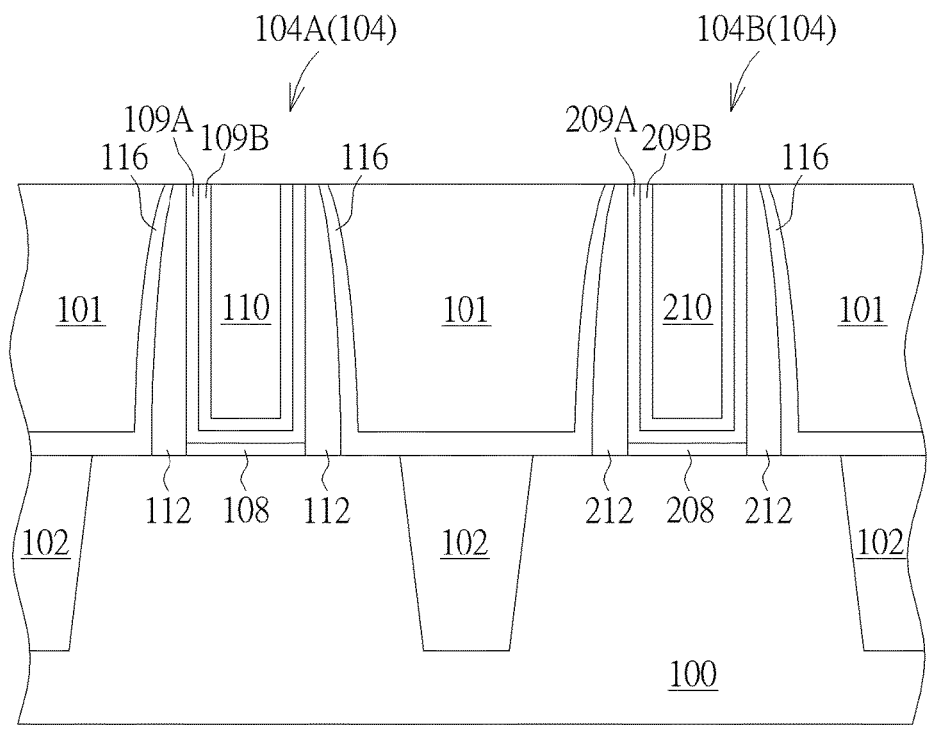
FIGS. 1-4 illustrate a forming method of a semiconductor structure according to a first embodiment of the present invention.

To provide a better understanding of the present invention to users skilled in the technology of the present invention, preferred embodiments are detailed as follows. The preferred embodiments of the present invention are illustrated in the accompanying drawings with numbered elements to clarify the contents and the effects to be achieved.

Please note that the figures are only for illustration and the figures may not be to scale. The scale may be further modified according to different design considerations. When referring to the words "up" or "down" that describe the relationship between components in the text, it is well known in the art and should be clearly understood that these words refer to relative positions that can be inverted to obtain a similar structure, and these structures should therefore not be precluded from the scope of the claims in the present invention.

FIGS. 1-6 illustrate a method of forming a semiconductor device according to a first embodiment of the present invention. Firstly, a substrate 100 is provided. At least two gate structures 104 are formed on the substrate 100, here the two gate structures are labeled as a first gate structure 104A and a second gate structure 104B respectively. The substrate 100 may include a semiconductor substrate, for example, a silicon substrate, an epitaxial silicon substrate, a silicon germanium substrate, a silicon carbide substrate or a silicon-on-insulator (SOI) substrate, or may include a non-semiconductor substrate such as a glass substrate, but this is not limited thereto. Moreover, at least one shallow trench isolation (STI) 102 may be previously formed in the substrate 100 to identify each active area. At least one fin structure (not shown) may be formed on the substrate 100, and should also be within the scope of the present invention.

Typical integrated circuits (e.g. semiconductor devices, semiconductor structures, etc.) may be divided into a plurality of active areas and a plurality of non-active areas. The active areas may include finFET devices (e.g. pFET, nFET, etc.). Each active area may have a different pattern density, different number of finFET devices, different type of finFET device(s), etc.

Each gate structure 104A/104B includes a gate dielectric layer 108/208, a high-k layer 109A/209A, a work function metal layer 109B/209B and a gate conductive layer 110/210. The material of the gate dielectric layer 108/208 may include at least one of silicon oxide (SiO), silicon nitride (SiN) and silicon oxynitride (SiON). The high-k layer 109A/209A includes material having a dielectric constant (k value) larger than 4 such as metallic oxide, hafnium oxide ($HfO_2$), hafnium silicon oxide ($HfSiO_4$), hafnium silicon oxynitride (HfSiON), aluminum oxide ($Al_2O_3$), lanthanum oxide ($La_2O_3$), tantalum oxide ($Ta_2O_5$), yttrium oxide ($Y_2O_3$), zirconium oxide (ZrO$_2$), strontium titanate oxide (SrTiO$_3$), zirconium silicon oxide (ZrSiO$_4$), hafnium zirconium oxide (HfZrO$_4$), strontium bismuth tantalate (SrBi$_2$Ta$_2$O$_9$, SBT), lead zirconate titanate (PbZrxTi$_1$-xO$_3$, PZT), barium strontium titanate (BaxSr$_1$-xTiO$_3$, BST) or a combination thereof.

The work function metal layer 109B/209B may include a p-type work function metal layer or an n-type work function metal layer (depends on the MOS is a PMOS or an NMOS). The p-type work function metal layer may include materials such as TiN, TaN, titanium carbide (TiC), tantalum carbide (TaC), tungsten carbide (WC), or aluminum titanium nitride (TiAlN), but not limited to this. The n-type work function metal layer may include materials such as titanium aluminide (TiAl), zirconium aluminide (ZrAl), tungsten aluminide (WAl), tantalum aluminide (TaAl), or hafnium aluminide (HfAl), but not limited to this.

The material of the gate conductive layer 110/210 may include undoped polysilicon, heavily doped polysilicon, or one or a plurality of metal layers such as a work function metal layer, a barrier layer and a low-resistance metal layer, etc. However, the present invention is not limited thereto, and the materials mentioned above can be adjusted according to actual requirements.

In addition, the present invention further comprises a plurality of spacers 112/212 located on both sides of the gate structures 104A/104B, respectively. The material of the spacers 112, 212 may include silicon nitride or silicon oxide. Thereafter, a contact etch stop layer (CESL) 116 is formed on the substrate 100 and covers the gate structures 104A/104B and the spacers 112/212, which may be a single layer or a multiple layer structure to apply the required compressive stress or tensile stress to the gate structure 104, but not limited thereto. In other embodiments, the step of forming the contact etch stop layer 116 may also be omitted. In addition, source/drain regions 106 are formed in the substrate 100 on both sides of the spacers 112/212. In another embodiment, a light doped drain (LDD, not shown) may further be formed in the substrate 100 selectively before the spacers 112/212 are formed according to actual requirements.

Figure 2:
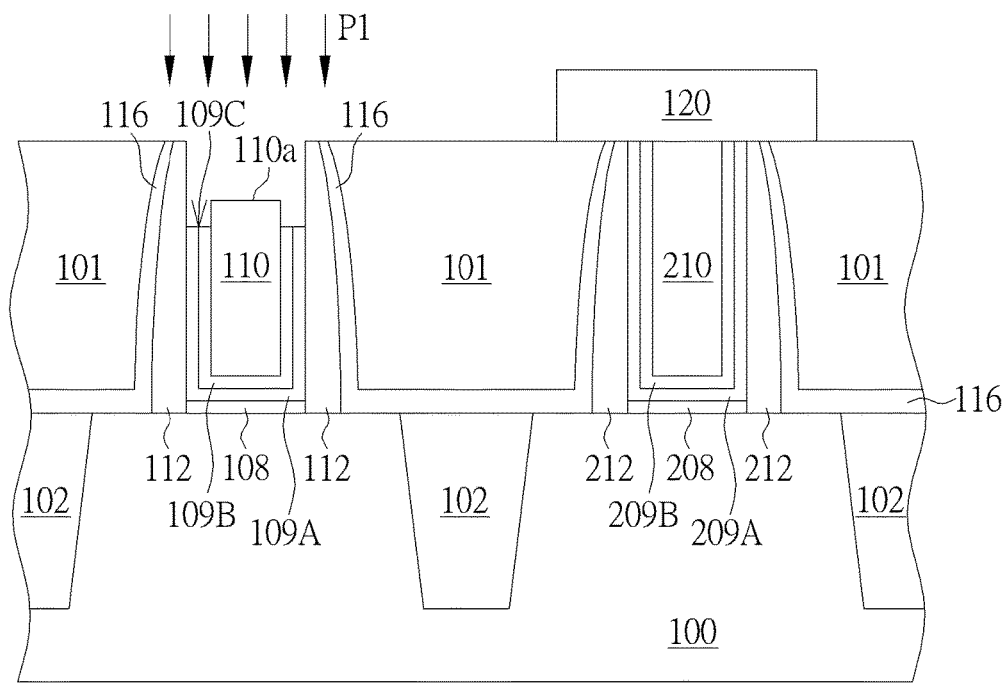

After the above-described elements are completed, in order to form the stress layer on a specific gate structure for providing the needed stress (such as the compressive stress or tensile stress), the following steps are performed, here taking the gate structure 104A as an example:

As shown in FIG. 2, a top portion of the gate structure 104A is partially removed by an etching process P1, and it is worth noting that the high-k layer 109A, the work function metal layer 109B, and the gate conductive layer 110 are partially removed through a single step etching process or a multiple steps etching process. After the etching process P1 is completed, the top surface 110a of the gate conductive layer 110 is preferably a flat top surface, and it is preferably higher than the top surface of the remaining high-k layer 109A and the work function metal layer 109B (defined as a top surface 109C). As for the gate structure 104B, since a stress layer is not formed on the gate structure 104B in this step, a mask layer 120 is formed on the gate structure 104B, to protect the gate structure 104B.

Figure 3:
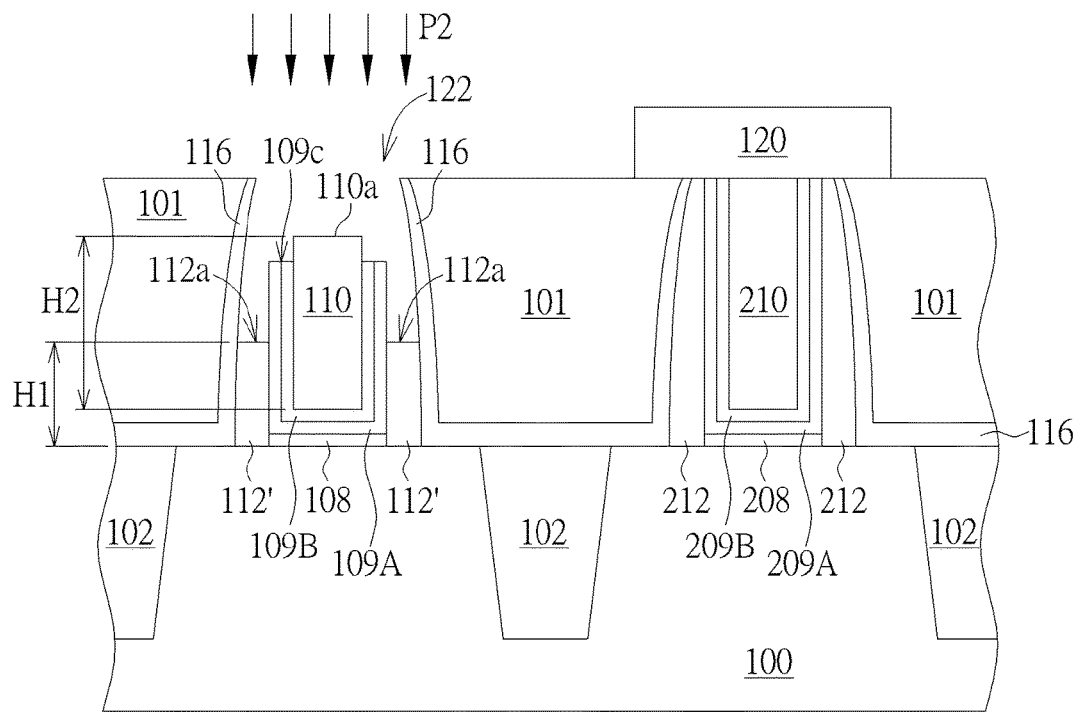
Figure 4:
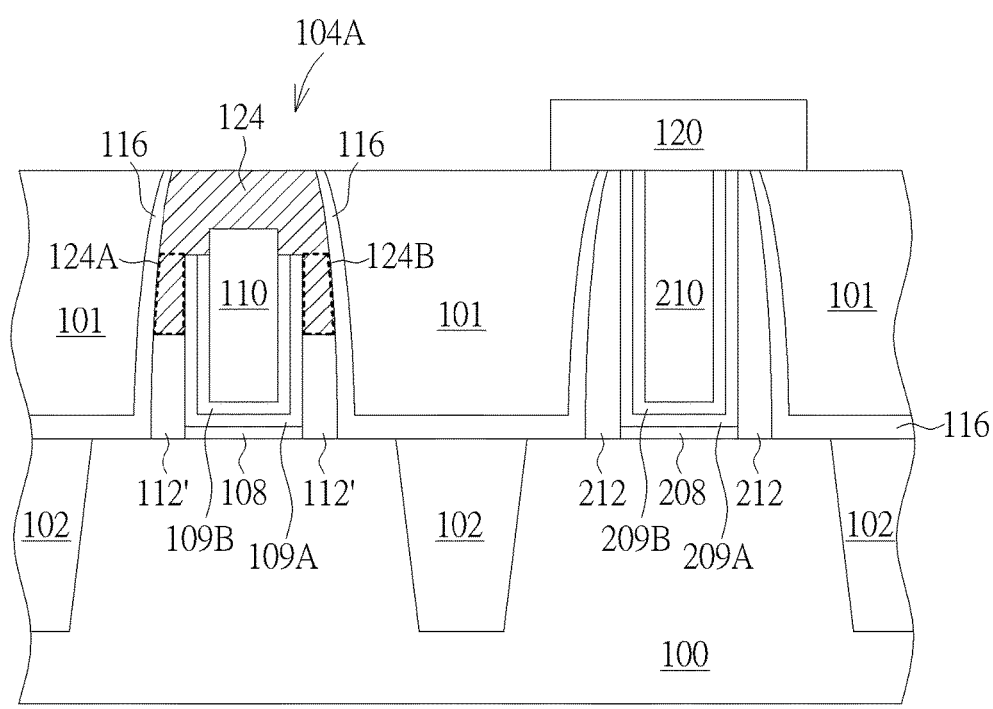

As shown in FIG. 3, another etching process P2 is performed again, to partially remove the spacers 112 and form an "inverted U-shaped" recess 122 at the upper portion of the gate structure 104A. The remaining spacers are defined as spacers 112'. It is noteworthy that a top surface 112a of each spacer 112' will be lower than the top surface 109C of the high-k layer 109A and the work function metal layer 109B. Besides, it is to be noted that the spacer 112 and the contact etch stop layer 116 contain different etching selectivity, so that after the etching process P2 is carried out, the spacers 112 are removed, but the contact etch stop layer 116 is hardly removed or only a small portion is removed. In this step, the top surface of the contact etch stop layer 116 will be higher than the top surface 112a of each spacer 112. In some embodiments, the top surface of the contact etch stop layer 116 will also be higher than the top surface 110a of the gate conductive layer 110. In this embodiment, after the etching process P2 is carried out, a height of the spacers 112' is defined as H1, the height of the gate conductive layer 110 is defined as H2, and preferably, H1 is smaller than half of H2. In other words, H1<H2/2, but not limited thereto.

Next, a stress layer is formed in the recess 122, and a planarization step or an etching back step (not shown) is performed to remove parts of the stress layer 122, and to form a stress cap layer 124 disposed right above the gate structure 104A, and the stress cap layer 124 is also disposed right above the spacers 112'. Since the stress cap layer 124 is filled into the recess 122, the stress cap layer 124 also has an inverted U-shaped cross section. Furthermore, the stress cap layer 124 includes two extension portions: 124A and 124B, the extension portion 124A or the extension portion 124B being positioned right above the spacer 112' and disposed between the contact etch stop layer 116 and the gate conductive layer 110.

The material of the stress cap layer 124 depend on whether the gate structure 104A is intended to be made into an n-type transistor or a p-type transistor. For example, if the gate structure 104A is an n-type transistor, the stress cap layer 124 is preferably selected from a material having tensile stress. Furthermore, additional processing steps, such as an annealing treatment, ultraviolet light processing, etc., may be performed to the stress cap layer 124 to further enhance its stress and is also within the scope of the present invention. It is also noted that in this embodiment, the contact etch stop layer 116 directly contacts partial sidewalls of the stress cap layer 124, and the stress cap layer 124 is not located right above the contact etch stop layer 116.

In the above steps, a stress cap layer is not formed over the gate structure 104B. In the subsequent step, it may be needed to form a different stress cap layer for the gate structure 104B. For example, if the gate structure 104A is an n-type transistor and the gate structure 104B is a p-type transistor, the steps of FIGS. 2-4 mentioned above will be repeatedly performed so as to form the stress cap layer for the gate structure 104B, and it is noteworthy that when the stress cap layer for the gate structure 104B is formed, a material having a compressive stress is selected. Since the other steps are substantially identical to that in the first preferred embodiment, and it will not be described repeatedly here. Thus, the semiconductor gate structure of the present invention has been completed, and a following-formed gate structure can be used to fabricate a transistor or a memory device, etc., which are well-known to those skilled in the art and are not to be described in detail.

The following description will detail the different embodiments of the semiconductor structure and the manufacturing method of the present invention. To simplify the description, the following description will detail the dissimilarities among the different embodiments and the identical features will not be redundantly described. In order to compare the differences between the embodiments easily, the identical components in each of the following embodiments are marked with identical symbols.

Figure 5:
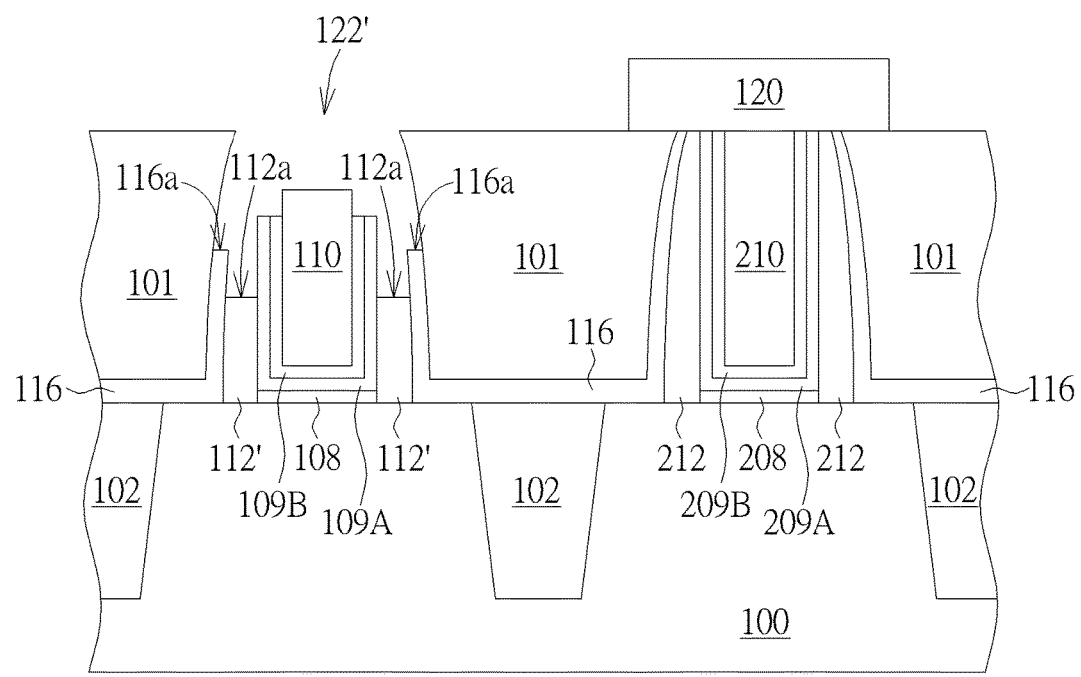
FIGS. 5-6 illustrate a forming method of a semiconductor structure according to a second embodiment of the present invention.
Figure 6:
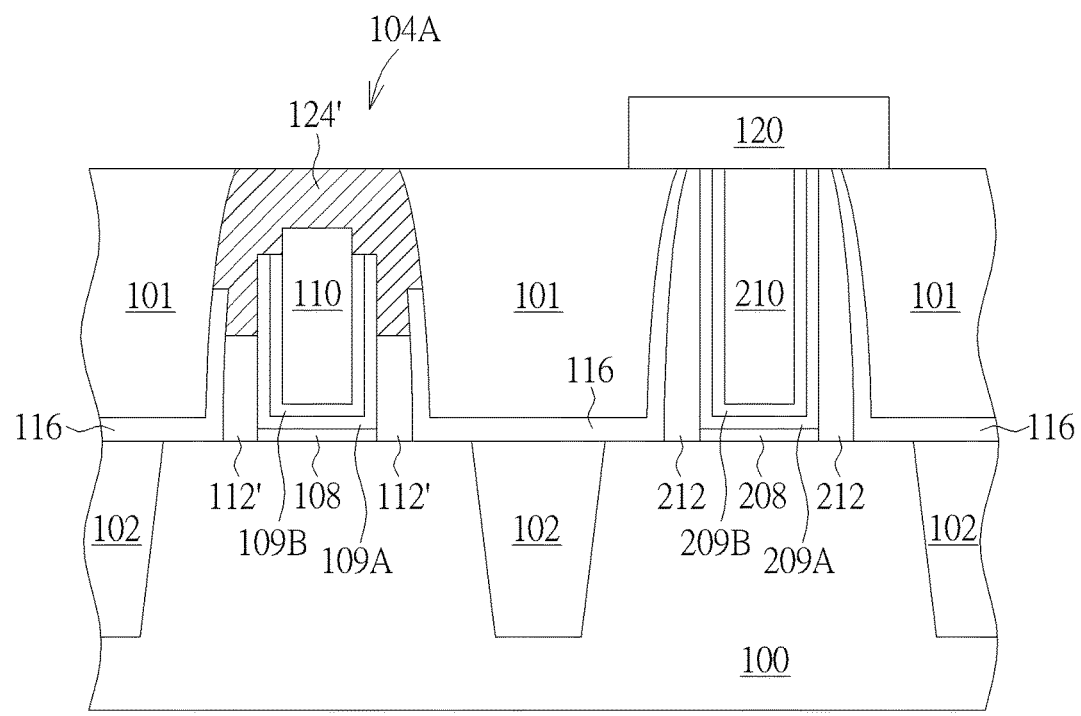

In the embodiment mentioned above, when the spacers 112 are partially removed and the recess 122 is formed, the contact etch stop layer 116 is not removed (or only a small portion is removed) so that the top surface of the contact etch stop layer 116 will be higher than the top surface 112a of the spacer 112'. However, in another embodiment of the present invention, referring to FIG. 5, if the material of each spacer 112 is similar to the material of the contact the etch stop layer 116, or to adjust the etching rate of the etching process P2, the CESL 116 may be removed during the etching process P2. Or in another case, another etching process may be performed after the etching process P2, to remove the CESL 116 to form a recess 122' at the top of the gate structure 104A. In this step, the top surface 116a of the contact etch stop layer 116 may still be higher than the top surface 112a of each spacer 112', but lower than the top surface 110a of the gate conductive layer 110 (as shown in FIG. 5), or lower than the top surface of the spacer 112' (not shown). Preferably, the top surface 116a of the contact etch stop layer 116 is still higher than the top surface of the substrate 100, but the present invention is not limited thereto, and the contact etch stop layer 116 may also be removed until a portion of the surface of the substrate 100 is exposed. The following steps are shown in FIG. 6, a stress cap layer 124' is formed in the recess 122', the stress cap layer 124' covers the top and sidewalls of the gate structure 104A, and stress cap layer 124' has an inverted U-shaped cross-sectional structure.

Figure 7:
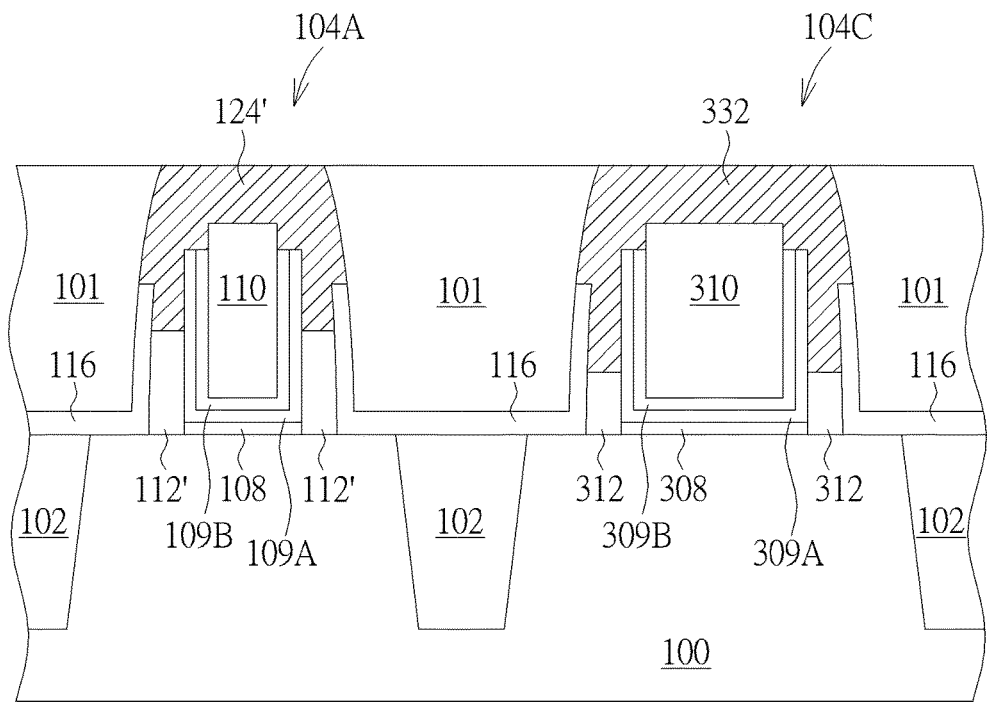
FIG. 7 shows the schematic diagram of the semiconductor structure according to another preferred embodiment of the present invention.

In another embodiment of the present invention, as shown in FIG. 7, except for the gate structure 104A, a gate structure 104C is further formed in the dielectric layer 101, the gate structure 104C and the gate structure 104A may have the same conductive type or different same conductive types. The gate structure 104C includes a gate dielectric layer 308, a high-k layer 309A, a work function metal layer 309B, a gate conductive layer 310, two spacers 312, and the top portion of the gate structure 104C further includes a stress cap layer 332. The size of the stress cap layer 332 is different from the size of the stress cap layer 124 of the gate structure 104A (e.g., the width or the depth of the extension portion). This embodiment should also be within the scope of the present invention.

Figure 8:
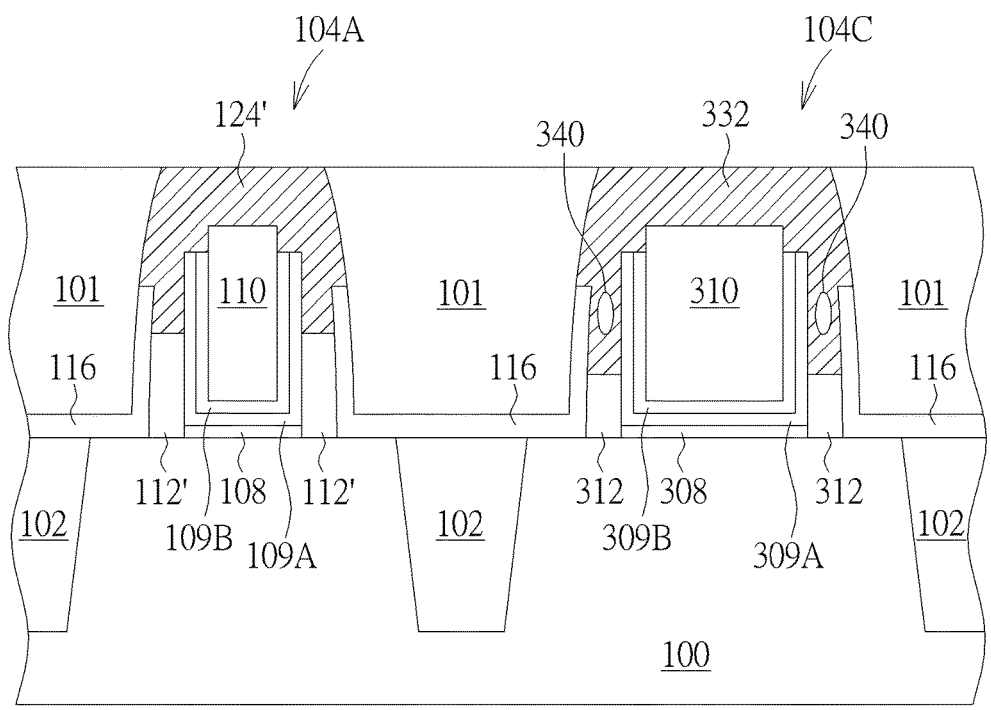
FIG. 8 shows the schematic diagram of the semiconductor structure according to another preferred embodiment of the present invention.

In another embodiment of the present invention, as shown in FIG. 8, a cavity 340 may be formed in the extension portion of the stress cap layer 332 during the formation of the stress cap layer 332. Preferably, the cavity 340 is lower than the top surface of the gate conductive layer 310, but not limited thereto. In addition, the cavity 340 is not limited to be disposed within the gate structure 104C, and it may also be located within the stress cap layer 124 of the gate structure 104A. This embodiment should also be within the scope of the present invention.

The present embodiment includes that the spacers are partially removed, and the following-formed stress cap layer is closer to the channel region of the transistor. The stress cap layer not only covers the gate structure, and also covers parts of the sidewalls of the gate structure, so that the coverage area is larger, and it is more effective to transfer the stress of the stress cap layer to the channel region.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method for fabricating a semiconductor structure, comprising:
   providing a substrate;
   forming a dielectric layer on the substrate;
   forming a gate conductive layer and two spacers disposed in the dielectric layer, wherein the two spacers are respectively disposed on both sides of the gate conductive layer;
   forming a high-k layer and a work function metal layer between the gate conductive layer and the substrate;
   removing parts of the gate conductive layer, parts of the high-k layer and parts of the work function metal layer;
   removing parts of the two spacers, wherein a top surface of the two spacers is lower than a top surface of the gate conductive layer, and wherein a top surface of the high-k layer and a top surface of the work function metal layer are higher than the top surface of the two spacers and lower than the top surface of the gate conductive layer; and
   forming a cap layer overlying the gate conductive layer and the two spacers, wherein parts of the cap layer is located right above the two spacers.

2. The method of claim 1, further comprising forming two contact etch stop layers (CESLs) on an outer sidewall of the two spacers respectively.

3. The method of claim 2, wherein a top surface of each contact etch stop layer is higher than the top surfaces of the two spacers.

4. The method of claim 2, wherein each contact etch stop layer contacts parts of the sidewall of the cap layer directly.

5. The method of claim 2, wherein the cap layer is not disposed right above each contact etch stop layer.

6. The method of claim 2, wherein a top surface of each contact etch stop layer is higher than the top surface of the gate conductive layer.

7. The method of claim 1, further comprising forming at least one cavity in the cap layer.

8. The method of claim 1, wherein a height of each one of the two spacers is lower than half of a height of the gate conductive layer after the two spacers are partially removed.

* * * * *